United States Patent
Eguchi

(10) Patent No.: US 7,166,923 B2
(45) Date of Patent: Jan. 23, 2007

(54) SEMICONDUCTOR DEVICE, ELECTRO-OPTICAL UNIT, AND ELECTRONIC APPARATUS

(75) Inventor: Tsukasa Eguchi, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/808,426

(22) Filed: Mar. 25, 2004

(65) Prior Publication Data

US 2004/0245641 A1    Dec. 9, 2004

(30) Foreign Application Priority Data

Mar. 26, 2003    (JP) ............... 2003-085529

(51) Int. Cl.
- H01L 23/48 (2006.01)
- H01L 23/52 (2006.01)
- H01L 29/40 (2006.01)
- H01L 29/04 (2006.01)
- H01L 29/15 (2006.01)

(52) U.S. Cl. .............. 257/776; 257/72; 257/758; 257/774; 257/734

(58) Field of Classification Search ............ 257/72, 257/758, 774, 776, 781, 736, 790, 786, 731, 257/734
See application file for complete search history.

(56) References Cited

U.S. PATENT DOCUMENTS

| | | | | |
|---|---|---|---|---|
| 4,289,574 A | * | 9/1981 | Radigan et al. ............ 438/669 |
| 4,298,574 A | * | 11/1981 | Bohl ............................ 422/97 |
| 6,099,746 A | | 8/2000 | Kim | |
| 6,104,040 A | * | 8/2000 | Kawachi et al. ............ 257/59 |
| 6,307,216 B1 | * | 10/2001 | Huh et al. .................... 257/59 |
| 6,465,806 B1 | * | 10/2002 | Kubota et al. ............... 257/72 |
| 6,828,042 B1 | * | 12/2004 | Imanishi ...................... 428/690 |

FOREIGN PATENT DOCUMENTS

| | | |
|---|---|---|
| CN | 1211829 A | 3/1999 |
| JP | 63-143845 | 6/1988 |
| JP | 1-109749 | 4/1989 |
| JP | 2-183536 | 7/1990 |
| JP | 7--106416 | 4/1995 |
| JP | 7-245343 | 9/1995 |
| JP | 8-17914 | 1/1996 |
| JP | 8-51149 | 2/1996 |
| JP | 11-003938 | 1/1999 |
| JP | 11-340320 | 12/1999 |
| JP | A 2000-310796 | 11/2000 |
| JP | A 2000-357735 | 12/2000 |
| KR | 1999-000275 | 1/1999 |

* cited by examiner

Primary Examiner—Nitin Parekh
(74) Attorney, Agent, or Firm—Oliff & Berridge, PLC

(57) ABSTRACT

The invention provides a semiconductor device that allows high-scale integration of a pattern layout to reduce the pitch of wiring lines without changing a design rule, and to provide an electro-optical unit and an electronic apparatus including the semiconductor device. The semiconductor device can include a substrate, which has the following layers thereon: in order, a first conductive layer, an insulating interlayer having a contact hole therein at a position where it overlaps the first conductive layer in plan view, and a second conductive layer electrically connected to the first conductive layer via the contact hole. The first conductive layer entirely overlaps the contact hole, while the second conductive layer partially overlaps the contact hole in plan view. The first conductive layer is in contact with the second conductive layer at a part of a bottom area of the contact hole.

10 Claims, 16 Drawing Sheets

(A)

(B)

(C)

(A)

(B)

(A)

(B)

(C)

SEMICONDUCTOR DEVICE, ELECTRO-OPTICAL UNIT, AND ELECTRONIC APPARATUS

BACKGROUND OF THE INVENTION

1. Field of Invention

The present invention relates to a semiconductor device in which contact holes in an insulating interlayer are used for electrical connections, and to an electro-optical unit and an electronic apparatus including the semiconductor device.

2. Description of Related Art

Recently, electro-optical devices including liquid crystal devices and electroluminescent (EL) display panels have become popular as display units of electronic apparatuses, such as mobile telephones, mobile computers, and video cameras. Such electro-optical devices have a plurality of elements including transistors and diodes mounted on a substrate to form predetermined circuits, and also have a plurality of wiring lines to electrically connect these elements.

In such wiring lines, lower and upper conductive layers having an insulating interlayer therebetween are electrically connected via a contact hole in the insulating interlayer. That is, with reference to FIGS. 16(A), 16(B), and 16(C), a substrate 240 has the following layers thereon: in order, a first conductive layer 210, an insulating interlayer 220 having a contact hole 221 therein at the position where it overlaps the first conductive layer 210 in plan view, and a second conductive layer 230 electrically connected to the first conductive layer 210 via the contact hole 221. In a known structure, both the first conductive layer 210 and the second conductive layer 230 overlap the entire contact hole 221 in plan view. Thus, the first conductive layer 210 is in contact with the second conductive layer 230 at the entire bottom area 222 of the contact hole 221. Herein, the second conductive layers 230 are, for example, a plurality of parallel wiring lines, and second conductive layers 250, which are also wiring lines, extend adjacent to the second conductive layers 230 in the same layer.

SUMMARY OF THE INVENTION

These wiring lines are formed by photolithography. The distance α between the adjacent wiring lines in the same layer, namely, the second conductive layer 230 and the second conductive layer 250 in an upper layer, is determined by a design rule defined by the photolithography technology and photolithography machine used. In a known technology, the width of the upper conductive layer 230, which is a wiring line, must be greater than the length of the contact hole 221. Consequently, a pitch β of the wiring lines, namely, the second conductive layer 230 and the second conductive layer 250 in the upper layer, cannot be reduced, which is a problem. As a result, although an increase of the number of pixels in an electro-optical unit requires a reduction of the pitch β of the wiring lines, this cannot be realized, which is a problem.

Accordingly, an object of the present invention is to provide a semiconductor device that allows high-scale integration of a pattern layout to reduce the pitch of wiring lines without changing the design rule, and to provide an electro-optical unit and an electronic apparatus including such a semiconductor device.

A semiconductor device according to the invention can include a first conductive layer formed on a substrate, an insulating interlayer over the first conductive layer, the insulating interlayer having a contact hole being at least partially disposed directly on the first conductive layer, and a second conductive layer formed on the insulating interlayer, the second conductive layer being electrically coupled to the first conductive layer through the contact hole. In addition, the contact hole extends beyond either an edge of the first conductive layer or an edge of the second conductive layer in plan view.

In the semiconductor device according to the invention, since the contact hole extends beyond either an edge of the first conductive layer or an edge of the second conductive layer in plan view, the width of the second conductive layer (or the first conductive layer) can be reduced to be smaller than the length of the contact hole. Accordingly, a pitch of the second conductive layers (or the first conductive layers) can be reduced although a design rule distance between the second conductive layers (or the first conductive layers) cannot be reduced.

In the semiconductor device according to the invention, one of the first conductive layer and the second conductive layer may entirely overlap the contact hole and the other conductive layer may partly overlap the contact hole in plan view. Herein, for example, the one of the conductive layers is the first conductive layer and the other conductive layer is the second conductive layer.

According to the invention, a plurality of said other conductive layers extends parallel to one another at a predetermined pitch. In addition, the one of the conductive layers intersects the other conductive layer.

According to the invention, the other conductive layer may overlap the contact hole that is shifted to one side of the other conductive layer. Alternatively, the other conductive layer may overlap the contact hole such that two opposing edges of the contact hole are outside of said other conductive layer.

Preferably, in the case where the contact hole is rectangular, the other conductive layer partially overlaps the contact hole in its lengthwise direction. In the case where the contact hole is rectangular, the other conductive layer may extend diagonally with respect to the edges of the contact hole. For example, the semiconductor device according to the invention is used for a substrate of an electro-optical unit to hold an electro-optical substance and pixels having pixel switching transistors and pixel electrodes are disposed in a matrix on the substrate of the electro-optical unit.

According to the invention, the electro-optical substance may be liquid crystal disposed between the substrate of the electro-optical unit and a counter substrate to achieve a liquid crystal unit.

According to the invention, the electro-optical substance may be an organic electroluminescent substance that constitutes light emitting elements on the substrate of the electro-optical unit to achieve an EL display panel.

The electro-optical unit according to the invention may be used for display units of electronic apparatuses, such as mobile computers and mobile telephones.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Embodiments according to the present invention will now be described with reference to the accompanying drawings.

Figure 1:
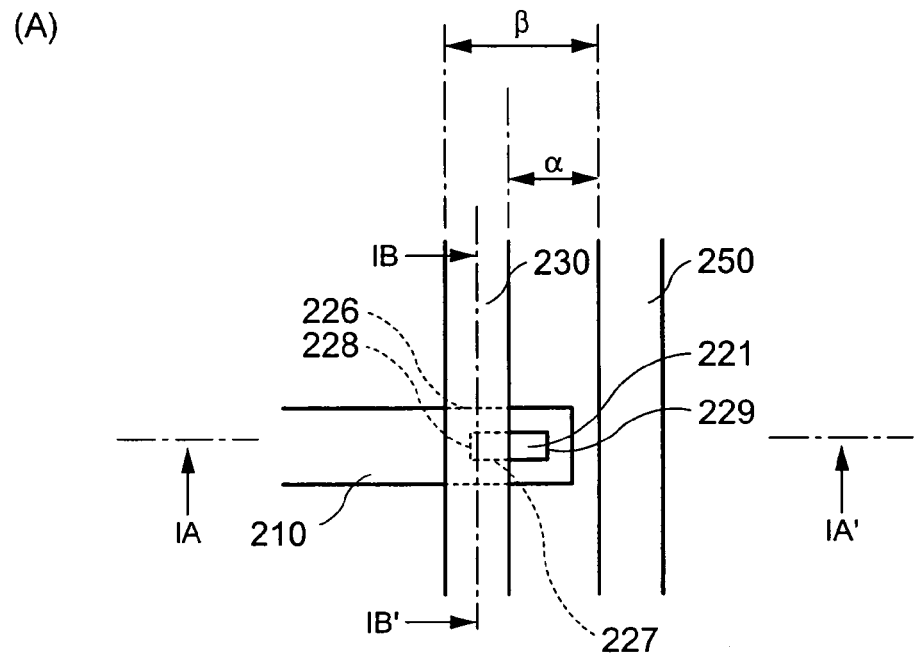
FIGS. 1(A), 1(B), and 1(C) are a plan view illustrating the relevant portion of the structure of a semiconductor device according to a first embodiment of the present invention, a sectional view along line IA–IA' in FIG. 1(A), and a sectional view along line IB–IB' in FIG. 1(A), respectively.
Figure 1:
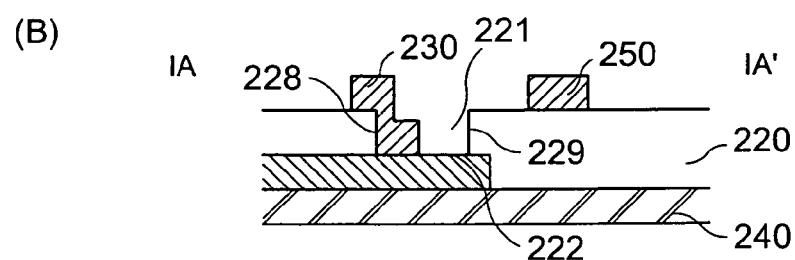
Figure 1:
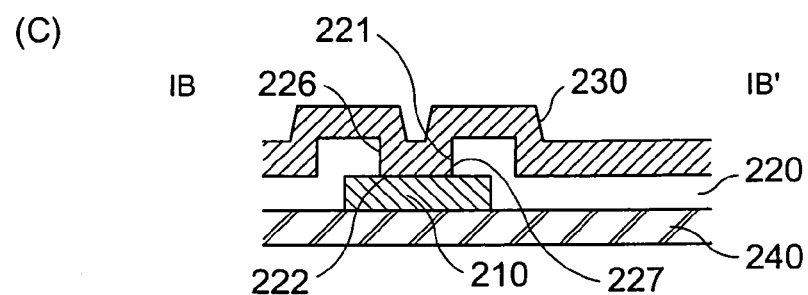

FIGS. 1(A), 1(B), and 1(C) are a plan view illustrating the relevant portion of the structure of a semiconductor device according to a first embodiment of the present invention, a sectional view along line IA–IA' in FIG. 1(A), and a sectional view along line IB–IB' in FIG. 1(A), respectively.

As shown in FIGS. 1(A), 1(B), and 1(C), a semiconductor device according to this embodiment has a plurality of elements including thin-film transistors and thin-film diodes (not shown) on a substrate 240. Also, the substrate 240 has the following layers thereon: in order, a first conductive layer 210, an insulating interlayer 220 having a contact hole 221 therein at the position where it overlaps the first conductive layer 210 in plan view, and a second conductive layer 230 electrically connected to the first conductive layer 210 via the contact hole 221. The second conductive layer 230 constitutes second wiring lines extending parallel to an adjacent second conductive layer 250 at a predetermined pitch β, while the first conductive layer 210 constitutes first wiring lines extending orthogonally to the second conductive layers 230 and 250.

In this embodiment, the first conductive layer 210 entirely overlaps the contact hole 221, while the second conductive layer 230 partially overlaps the contact hole 221 in plan view. That is, the second conductive layer 230 is formed at a position shifted with respect to the contact hole 221 in the direction going away from the adjacent second conductive layer 250. Therefore, the contact hole 221 extends beyond an edge of the second conductive layer 230 in plan view, and the first conductive layer 210 is in contact with the second conductive layer 230 at a part of the bottom area 222 of the contact hole 221.

Herein, the contact hole 221 is rectangular in plan view. The second conductive layer 230 partially overlaps the contact hole 221 in its lengthwise direction. Accordingly, the second conductive layer 230 partially overlaps a pair of long opposing edges 226 and 227 of the contact hole 221. On the other hand, the second conductive layer 230 entirely overlaps a short edge 228, which is one of the short edges 228 and 229 of the contact hole 221, namely, the edge further from the adjacent second conductive layer 250, but does not overlap the short edge 229, which is closer to the adjacent second conductive layer 250, at all.

In such a semiconductor device, a distance a between the adjacent wiring lines in the same layer, namely, the upper second conductive layers 230 and 250, is determined by the design rule defined by the photolithography technology and photolithography machine used. In this embodiment, the width of the second conductive layer 230 can be reduced to be smaller than a width that entirely overlaps the contact hole 221 within the allowed dimensional tolerance. Consequently, a pitch β of the second conductive layers 230 and 250 can be reduced without reducing the design rule distance α between the second conductive layers 230 and 250.

Figure 2:
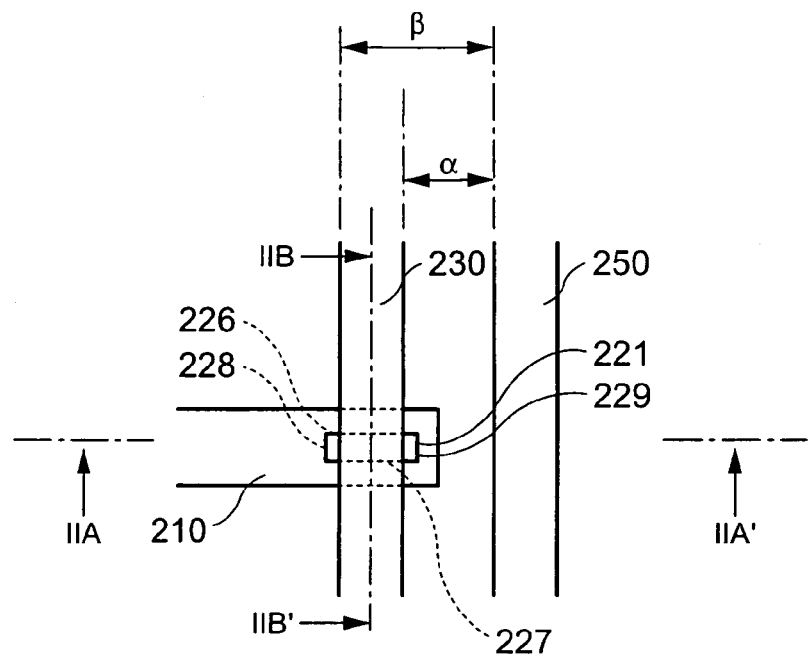
FIGS. 2(A), 2(B), and 2(C) are a plan view illustrating the relevant portion of the structure of a semiconductor device according to a second embodiment of the present invention, a sectional view along line IIA–IIA' in FIG. 2(A), and a sectional view along line IIB–IIB' in FIG. 2(A), respectively.
Figure 2:
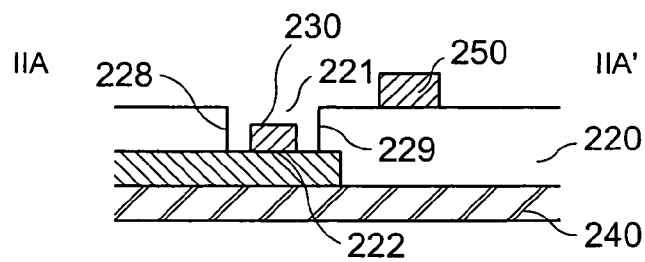
Figure 2:
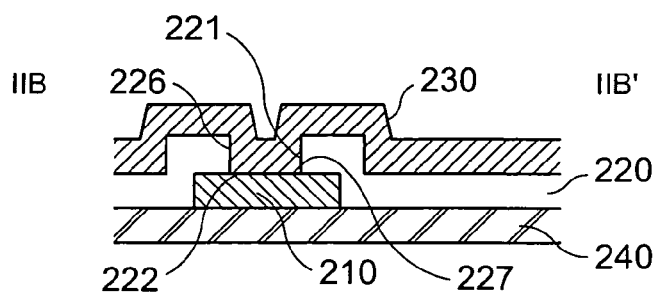

FIGS. 2(A), 2(B), and 2(C) are a plan view illustrating the structure of the relevant portion of a semiconductor device according to a second embodiment of the present invention, a sectional view along line IIA–IIA' in FIG. 2(A), and a sectional view along line IIB–IIB' in FIG. 2(A), respectively.

As shown in FIGS. 2(A), 2(B), and 2(C), as in the first embodiment, a substrate 240 of a semiconductor device according to this embodiment has the following layers thereon: in order, a first conductive layer 210, an insulating interlayer 220 having a contact hole 221 therein at the position where it overlaps the first conductive layer 210 in plan view, and a second conductive layer 230 electrically connected to the first conductive layer 210 via the contact hole 221. The second conductive layer 230 constitutes second wiring lines extending parallel to an adjacent second conductive layer 250 at a predetermined pitch β, while the first conductive layer 210 constitutes first wiring lines extending orthogonally to the second conductive layers 230 and 250.

In this embodiment, the first conductive layer 210 entirely overlaps the contact hole 221, while the second conductive layer 230 partially overlaps the contact hole 221 in plan view. The second conductive layer 230 overlaps the contact hole 221 such that two opposing edges of the contact hole 221 are outside of the second conductive layer 230. Therefore, the contact hole 221 extends beyond both edges of the second conductive layer 230 in plan view, and the first conductive layer 210 is in contact with the second conductive layer 230 at a part of the bottom area 222 of the contact hole 221.

Herein, the contact hole 221 is rectangular in plan view. The second conductive layer 230 overlaps a center part of the contact hole 221 in its lengthwise direction. Accordingly, the second conductive layer 230 overlaps the center part between a pair of long opposing edges 226 and 227 of the contact hole 221. On the other hand, the second conductive layer 230 overlaps neither the short edge 228 nor the short edge 229 at all.

In such a semiconductor device, as in the first embodiment, a distance α between the adjacent wiring lines in the same layer, namely, the upper second conductive layers 230 and 250, is determined by the design rule defined by the photolithography technology and photolithography machine used. In this embodiment, the width of the second conductive layer 230 can be reduced to be smaller than a width that entirely overlaps the contact hole 221 within the allowed dimensional tolerance. Consequently, a pitch β of the second conductive layers 230 and 250 can be reduced without reducing the design rule distance α between the second conductive layers 230 and 250.

Figure 3:
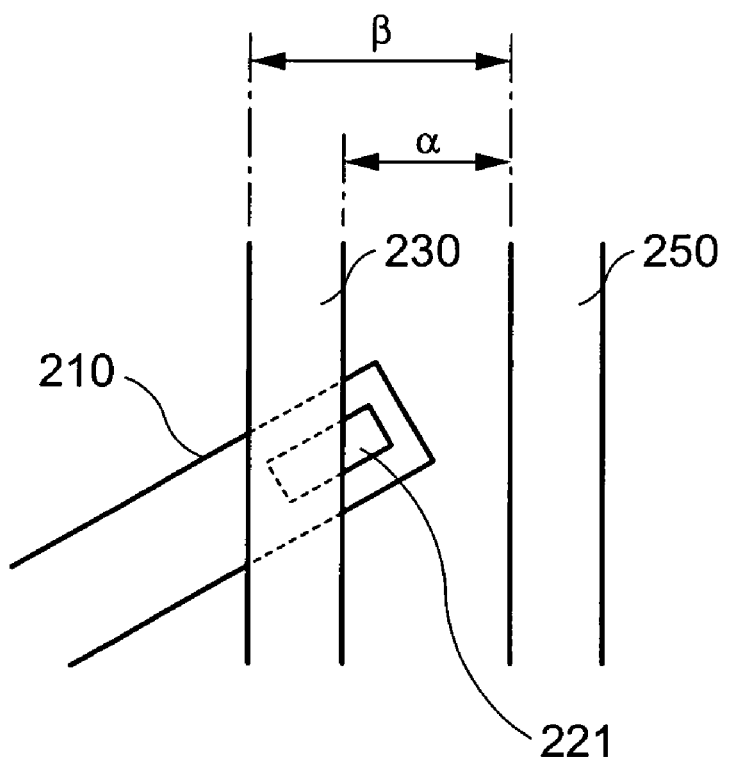
FIG. 3 is a plan view illustrating the structure of the relevant portion of a semiconductor device according to a third embodiment of the present invention.

FIG. 3 is a plan view illustrating the structure of the relevant portion of a semiconductor device according to a third embodiment of the present invention.

As shown in FIG. 3, as in the first and the second embodiments, a first conductive layer 210 is electrically connected to a second conductive layer 230 via a contact hole 221 in an insulating interlayer 220. The first conductive layer 210 entirely overlaps the contact hole 221, while the second conductive layer 230 partially overlaps the contact hole 221 in plan view. Therefore, the contact hole 221 extends beyond an edge of the second conductive layer 230 in plan view, and the first conductive layer 210 is in contact with the second conductive layer 230 at a part of the bottom area 222 of the contact hole 221.

Herein, the second conductive layer 230 and the second conductive layer 250 extend in parallel at a predetermined spacing therebetween. The first conductive layer 210 extends so as to diagonally cross the second conductive layer 230. Accordingly, the second conductive layer 230 extends diagonally with respect to all the edges of the contact hole 221.

In such a semiconductor device, as in the first and the second embodiments, a pitch β of the second conductive layers 230 and 250 can be reduced without reducing the design rule distance α between the second conductive layers 230 and 250.

Figure 4:
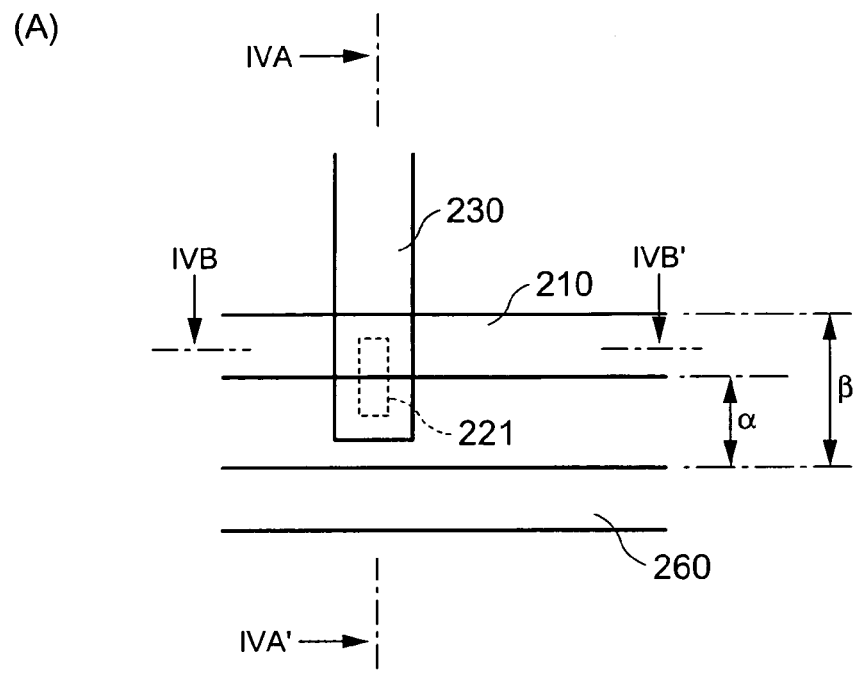
FIGS. 4(A), 4(B), and 4(C) are a plan view illustrating the relevant portion of the structure of a semiconductor device according to a fourth embodiment of the present invention, a sectional view along line IVA–IVA' in FIG. 4(A), and a sectional view along line IVB–IVB' in FIG. 4(A), respectively.
Figure 4:
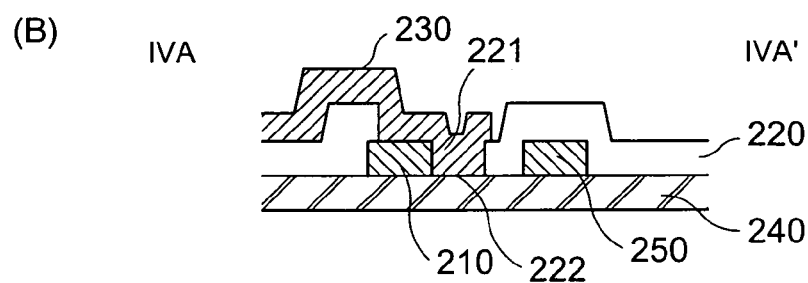
Figure 4:
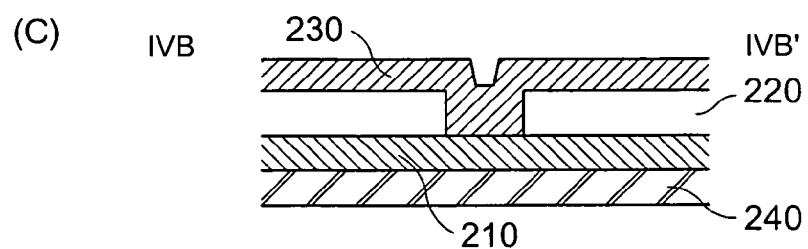

FIGS. 4(A), 4(B), and 4(C) are a plan view illustrating the structure of the relevant portion of a semiconductor device according to a fourth embodiment of the present invention, a sectional view along line IVA–IVA' in FIG. 4(A), and a sectional view along line IVB–VB' in FIG. 4(A), respectively.

In the first, the second, and the third embodiments, the first conductive layer 210 entirely overlaps the contact hole 221, while the second conductive layer 230 partially overlaps the contact hole 221 in plan view. In this embodiment, the positions may be reversed. That is, as shown in FIGS. 4(A), 4(B), and 4(C), like the first, the second, and the third embodiments, a substrate 240 of a semiconductor device according to this embodiment has the following layers thereon: in order, a first conductive layer 210, an insulating interlayer 220 having a contact hole 221 therein at the position where it overlaps the first conductive layer 210 in plan view, and a second conductive layer 230 electrically connected to the first conductive layer 210 via the contact hole 221.

In contrast with other embodiments, in this embodiment, the second conductive layer 230 entirely overlaps the contact hole 221, while the first conductive layer 210 partially overlaps the contact hole 221 in plan view. Therefore, the contact hole 221 extends beyond an edge of the first conductive layer 210 in plan view, and the first conductive layer 210 is in contact with the second conductive layer 230 at a part of the bottom area 222 of the contact hole 221.

In such a semiconductor device, a distance α between the adjacent wiring lines in the same layer, namely, the lower conductive layers 210 and a lower conductor layer 260, is also determined by a design rule defined by the photolithography technology and photolithography machine used. In this embodiment, the width of the first conductive layer 210 can be reduced to be smaller than a width that entirely overlaps the contact hole 221 within the allowed dimensional tolerance. Consequently, a pitch β of the first conductive layers 210 and 260 can be reduced without reducing the design rule distance α between the first conductive layers 210 and 260.

An example in which the present invention is applied to a liquid crystal unit, which is a typical electro-optical unit, will now be described. In the accompanying drawings, the scales of the layers and the other elements are appropriately altered from the actual ones to enable them to be easily viewed. In the following description, two mutually orthogonal directions on a substrate are referred to as "X direction" and "Y direction", and the extending direction of scanning lines is the X direction and the extending direction of data lines is the Y direction. On the contrary, the extending direction of the scanning lines may be the Y direction and the extending direction of the data lines may be the X direction.

Figure 5:
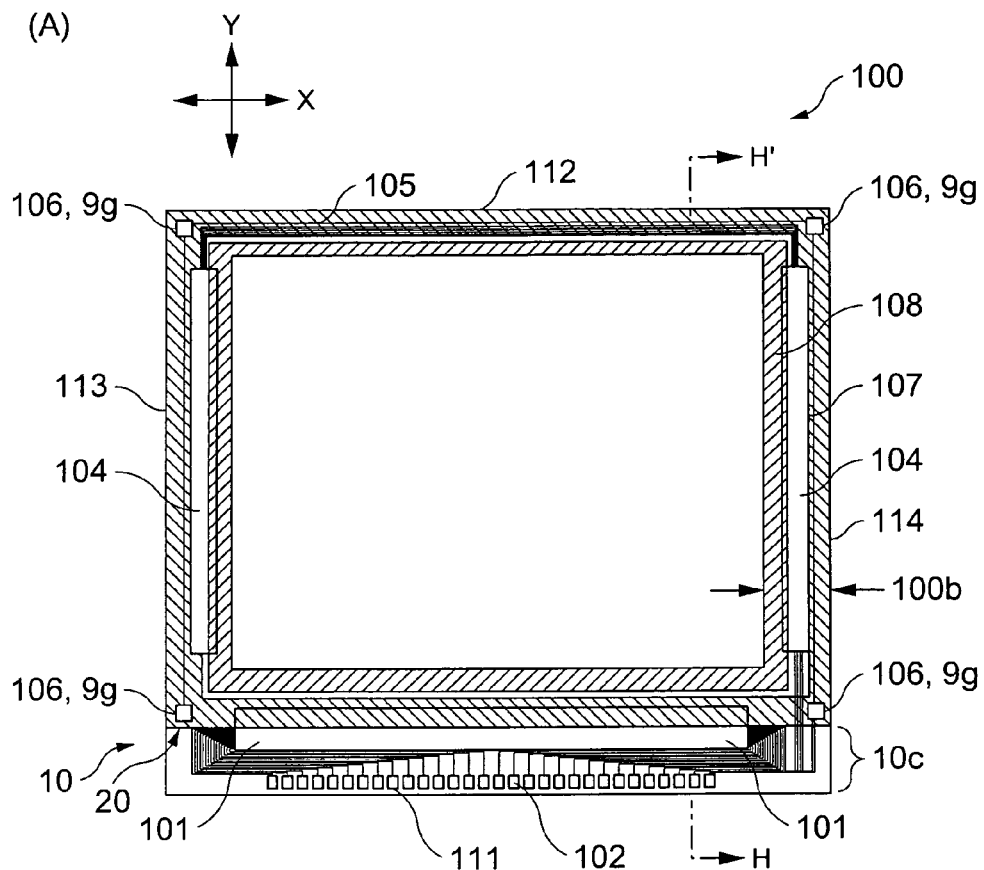
FIGS. 5(A) and 5(B) are a plan view, viewed from a counter substrate side, of a liquid crystal unit according to the first embodiment of the present invention having components thereon and a sectional view, including the counter substrate, along line H–H' in FIG. 5(A), respectively.
Figure 5:
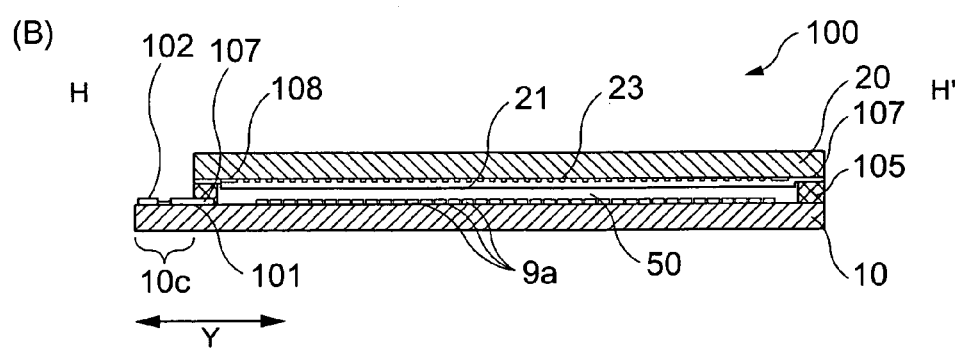

FIGS. 5(A) and 5(B) are a plan view, viewed from a counter substrate side, of a liquid crystal unit having its components thereon and a sectional view of the liquid crystal unit, including a counter substrate, along line H–H' in FIG. 5(A), respectively.

With reference to FIG. 5(A), a TFT array substrate (semiconductor device) 10 of a liquid crystal unit (electro-optical unit) 100 has a seal 107, as shown by oblique lines that slant to the right in FIG. 5(A), thereon along the edges of a counter substrate 20. The TFT array substrate 10 and the counter substrate 20 are bonded with the seal 107, which provides a predetermined gap therebetween. On an outer edge 111 of the TFT array substrate 10, a data line driving circuit 101 is formed so as to partially overlap the seal 107. On outer edges 113 and 114 of the TFT array substrate 10, scanning line driving circuits 104 are formed. In an overhanging area 10c of the TFT array substrate 10 which extends past the counter substrate 20, a plurality of terminals 102 are disposed. On an outer edge 112 of the TFT array substrate 10 that opposes the edge 111, a plurality of wiring lines 105 are formed to connect together the scanning line driving circuits 104, which are disposed on both sides of an image display area 10a shown in FIG. 6.

At four corners of the counter substrate 20, substrate-connecting electrodes 9g and substrate-connecting components 106 are formed to electrically connect the TFT array substrate 10 and the counter substrate 20. The number of substrate-connecting electrodes 9g may be appropriately selected.

In the case where the delay of scanning signals applied to the scanning lines is not a problem, it is apparent that the scanning line driving circuit 104 may be disposed on only one side. In this case, the data line driving circuits 101 may be disposed on both sides of the image display area 10a.

As shown in FIG. 5(B), the TFT array substrate 10 is bonded to the counter substrate 20 with the seal 107 therebetween, which provides a gap therebetween. The gap holds liquid crystal 50. The seal 107 is an adhesive to bond the TFT array substrate 10 and the counter substrate 20 together at their peripheries. The seal 107 can be made of light-curable resin or thermosetting resin containing gap spacers, such as glass beads or glass fibers, to maintain a predetermined gap between the substrates.

The TFT array substrate 10 has pixel electrodes 9a in a matrix thereon, as will be described in greater detail below. On the other hand, the counter substrate 20 has a light shielding film 108 made of a light shielding material, which forms a peripheral partition, inside the seal 107. The counter substrate 20 has a light shielding film 23, known as a black matrix or black stripes, thereon at the position opposing the longitudinal and transverse boundaries of the pixel electrodes 9a on the TFT array substrate 10. A counter electrode 21 made of an ITO film is formed on the light shielding film 23.

When this liquid crystal unit 100 is used for projection display units (liquid crystal projectors), three liquid crystal units 100 are used as light valves for the colors R, G, and B. Since light is resolved into colors R, G, and B by a dichroic mirror and light of each color is incident on the corresponding liquid crystal unit 100, the liquid crystal units 100 do not require color filters. However, when the liquid crystal unit 100 is used for color display units of electronic apparatuses including mobile computers, mobile telephones, and liquid crystal TVs, color filters for R, G, and B, and protective films (not shown) are formed on the counter substrate 20 at the positions opposing the pixel electrodes 9a, as will be described hereinafter.

Figure 6:
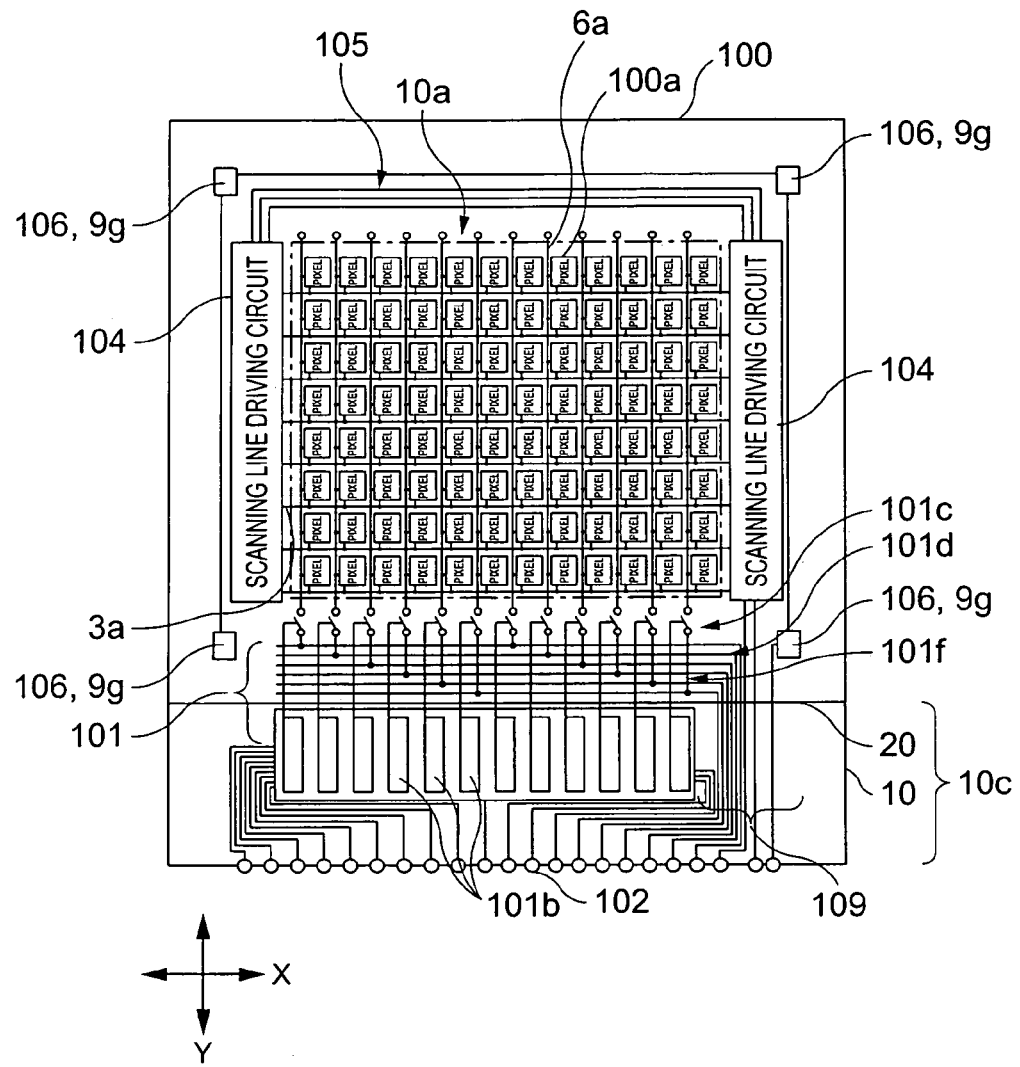
FIG. 6 is a schematic block diagram of a TFT array substrate 10 included in the liquid crystal unit shown in FIG. 5.
Figure 7:
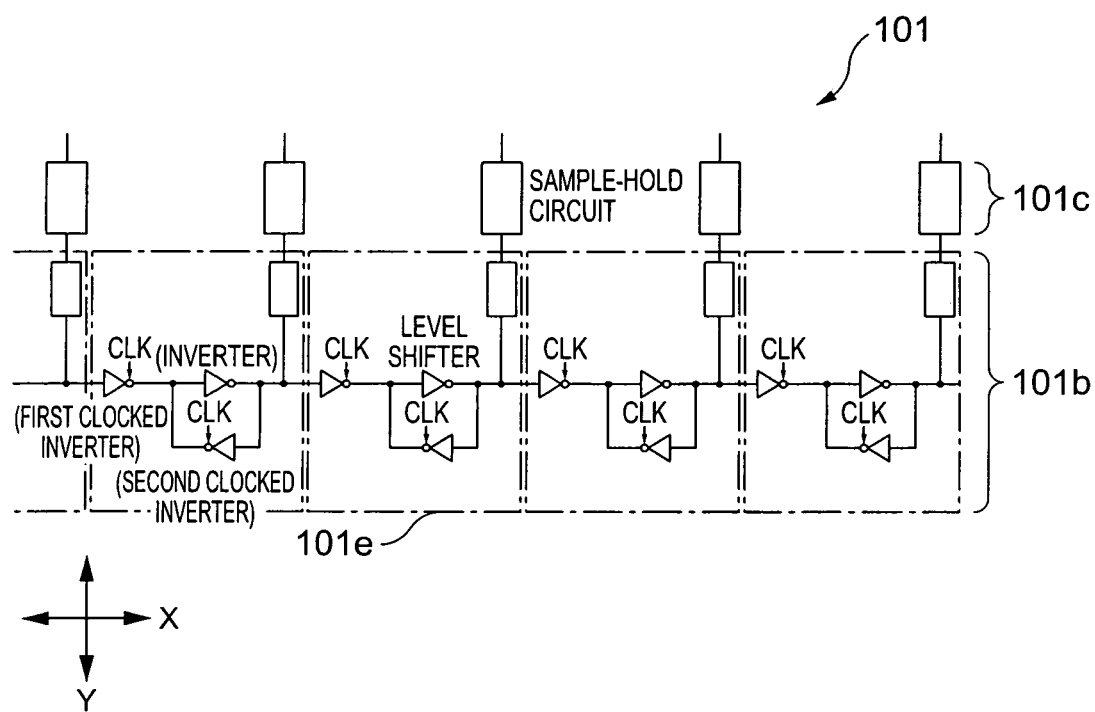
FIG. 7 is a view for explaining a data line driving circuit shown in FIG. 6.

FIG. 6 is a schematic block diagram of the TFT array substrate 10 having driving circuits therein for the liquid crystal unit 100. FIG. 7 is a view for explaining a data line driving circuit 101 formed in the TFT array substrate 10. FIGS. 8(A), 8(B), and 8(C) are a plan view of wiring lines electrically connected through contact holes in the liquid crystal unit 100, a sectional view along line VIIIA–VIIIA' in FIG. 8(A), and a sectional view along line VIIIB–VIIIB' in FIG. 8(A), respectively.

As shown in FIG. 6, two mutually orthogonal directions on the TFT array substrate 10 are referred to as the "X direction" and "Y direction", and a plurality of data lines 6a extend in the Y direction and a plurality of the scanning lines 3a extend in the X direction. The intersections of the data lines 6a and the scanning lines 3a define a plurality of pixels 100a in a matrix having a predetermined pitch. The matrix of the pixels 100a defines an active image display area 10a.

On the outer edge 111 of the TFT array substrate 10, a plurality of terminals 102 are disposed. The terminals 102 are made from conductive films, such as metal films including aluminum films, metal silicide films, and ITO films. Constant voltages, modulated image signals, and various drive signals are input to the terminals 102. A plurality of wiring lines 109 made from low-resistance metal films, such as aluminum films, extend from the terminals 102 in order to drive the data line driving circuit 101 and the scanning line driving circuits 104.

The image display area 10a has a peripheral area, that is, a flange area 100b shown in FIG. 5(A). In a region of the peripheral area next to the TFT array substrate 10 in the Y direction, the data line driving circuit 101 is formed. The data line driving circuit 101 includes shift register circuits 101b, sample-hold circuits 101c having analog switches controlled by signals from the shift register circuits 101b, and six image signal lines 101d that correspond to respective six phases developed from an image signal.

In the data line driving circuit 101, the shift register circuits 101b and the sample-hold circuits 101c are in one-to-one correspondence with the data lines 6a and pixel lines connected to the data lines 6a. That is, with reference to FIG. 7, the sample-hold circuit 101c is formed for each data line 6a. In the shift register circuits 101b, one inverter and two clocked inverters, and one level shifter are formed for each data line 6a. The one inverter and the two clocked inverters, and the one level shifter define a unit circuit 101e.

In the TFT array substrate 10, with reference to FIG. 8(A), the six image signal lines 101d extend in parallel to one another with a predetermined pitch. Also, a plurality of wiring lines 101f extend from the sample-hold circuits 101c in parallel to one another with a predetermined pitch. The wiring lines 101f and the image signal lines 101d are electrically connected at their intersections.

To achieve these electrical connections, in this embodiment, with reference to FIGS. 8(B) and 8(C), the first conductive layer 210, which constitutes the six image signal lines 101d, and the second conductive layer 230, which constitutes the wiring lines 101f from the sample-hold circuits 101c, can be electrically connected via the contact hole 221 in the insulating interlayer 220. As described in the first embodiment, the first conductive layer 210 (the image signal line 101d) is connected to the second conductive layer 230 (the wiring line 101f from the sample hold circuit 101c) at a part of the bottom area 222 of the contact hole 221. Accordingly, the width of the second conductive layer 230 (the wiring line 101f from the sample-hold circuit 101c) can be reduced to be smaller than a width that entirely overlaps the contact hole 221 within the allowed dimensional tolerance. Consequently, a pitch β of the second conductive layers 230 (the wiring lines 101f from the sample-hold circuits 101c) can be reduced without reducing the design rule distance α between the second conductive layers 230 (the wiring lines 101f from the sample-hold circuits 101c). As a result, the number of pixels can be increased.

Figure 9:
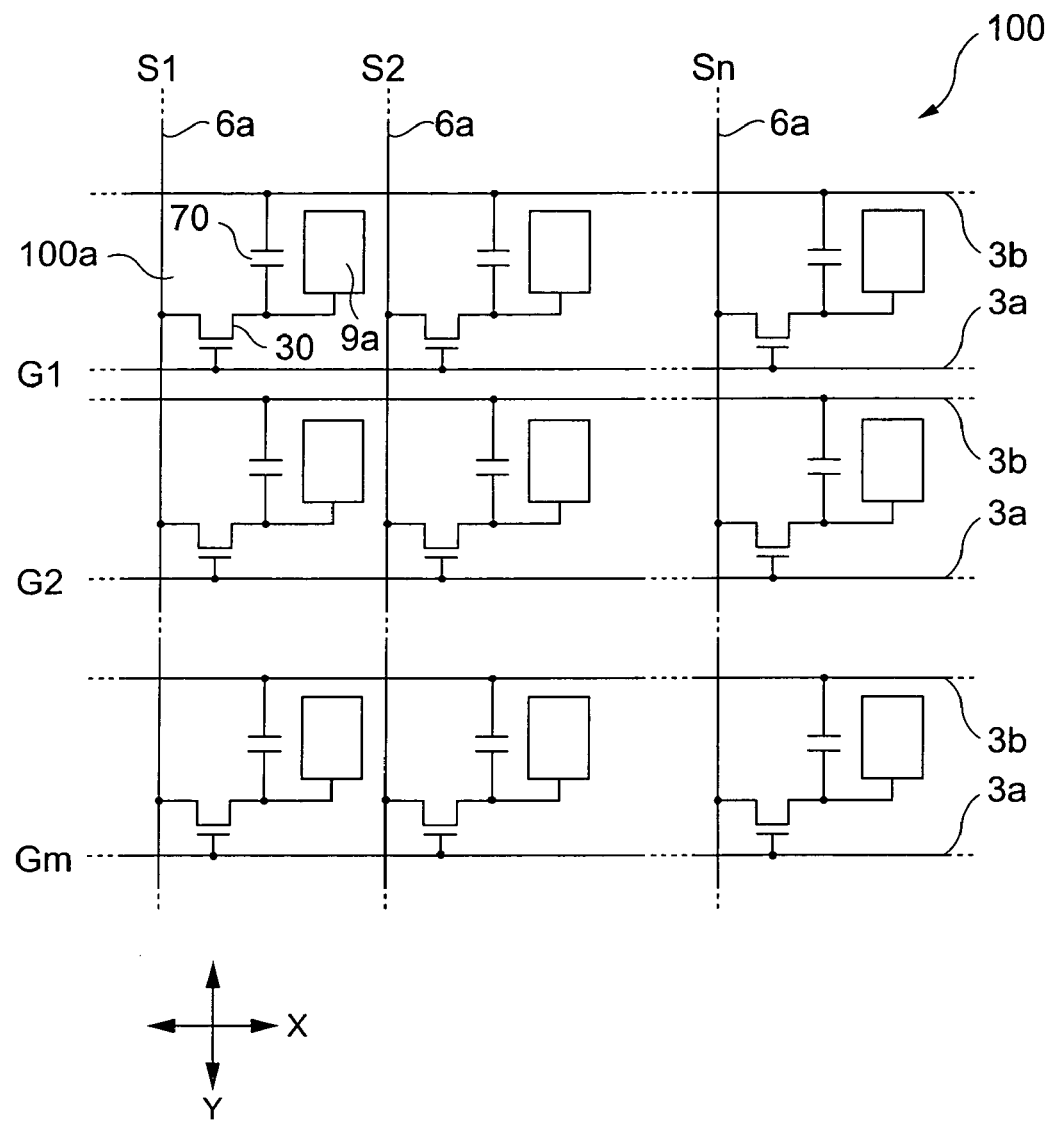
FIG. 9 is a diagram of an equivalent circuit of various elements and wiring lines in a plurality of pixels arranged in a matrix to define the image display area shown in FIG. 6.

FIG. 9 is a diagram of an equivalent circuit of various elements and wiring lines in a plurality of pixels arranged in a matrix to define an image display area 10a of the liquid crystal unit 100 according to the present invention.

With reference to FIG. 9, in an image display area 10a of the liquid crystal device 100, each of a plurality of pixels 100a arranged in a matrix includes a pixel electrode 9a and a TFT 30, which is a switching element that controls the pixel electrode 9a. Data lines 6a are electrically connected to the sources of the TFTs 30 to supply pixel signals. The pixel signals S1, S2, . . . , Sn are supplied to the data lines 6a in this order in a line-at-a-time addressing manner. Scanning lines 3a are electrically connected to the gates of the TFTs 30. Pulsed scanning signals G1, G2, . . . , Gm are applied to the scanning lines 3a in this order in a line-at-a-time addressing manner at a predetermined timing. The pixel electrodes 9a are electrically connected to the drains of the TFTs 30, which write the pixel signals S1, S2, . . . , Sn supplied from the data lines 6a at a predetermined timing by turning on the switching element TFTs 30 for a predetermined period of time. Thus, pixel signals S1, S2, . . . , Sn, which have predetermined levels and are written into liquid crystal via the pixel electrodes 9a, are maintained between the pixel electrodes 9a and the counter electrode 21 of the counter substrate 20, which is described with reference to FIG. 5(B) above, for a predetermined period of time.

Herein, to the TFT array substrate 10, to prevent leakage of the maintained pixel signal, an optional storage capacitor 70 can be connected in parallel with a liquid crystal capacitor formed between the pixel electrode 9a and the counter electrode 21. The storage capacitor 70 maintains a voltage of the pixel electrode 9a for a long period of time, for example, three orders of magnitude longer than the source voltage application period. Accordingly, the liquid crystal unit 100 having high contrast display due to improved charge retention characteristics can be achieved. The storage capacitor 70 may be formed either between capacitor lines 3b, which are wiring lines to form a capacitance, or between the above-described scanning lines 3a.

Figure 10:
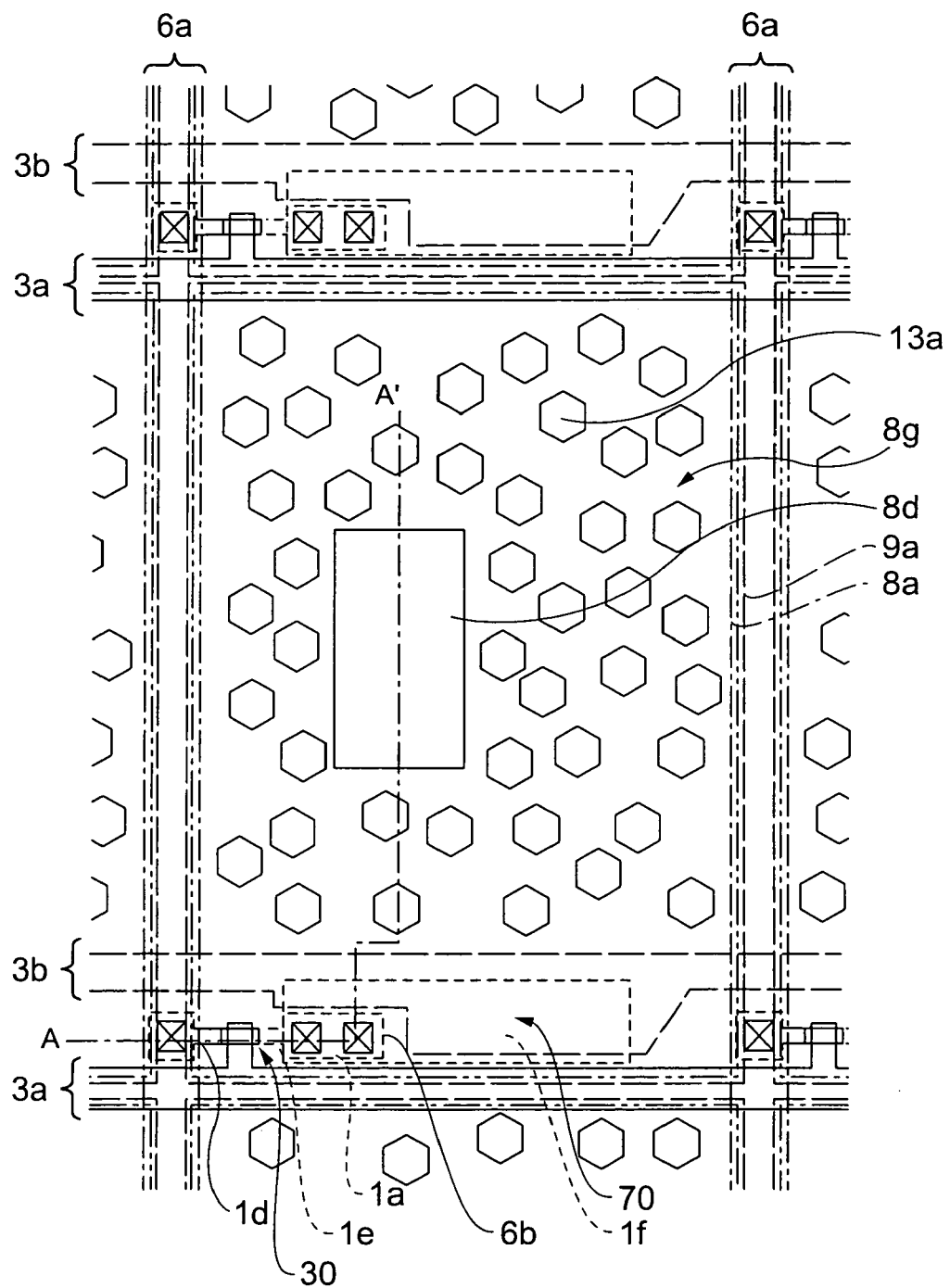
FIG. 10 is a plan view of the pixels on the TFT array substrate shown in FIG. 9.
Figure 11:
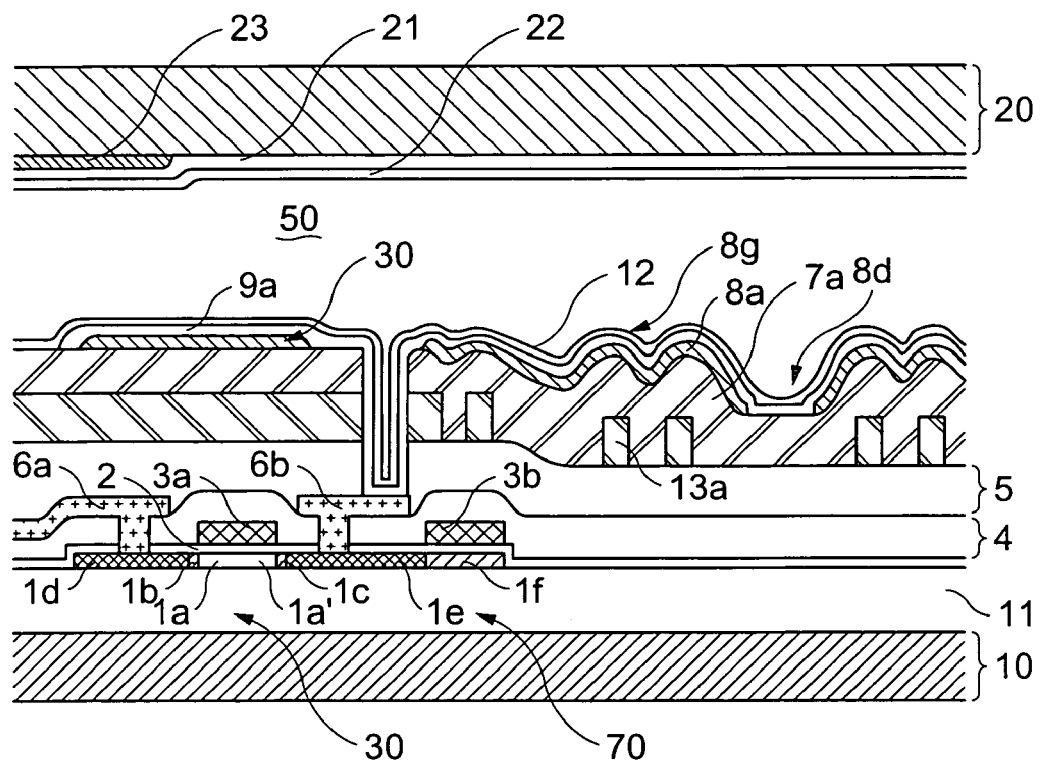
FIG. 11 is a sectional view along line A–A' in FIG. 10.

FIG. 10 is a plan view of adjacent pixels on a TFT array substrate. FIG. 11 shows a sectional view along line A–A' in FIG. 10 and a sectional view of the TFT array substrate and the counter substrate with liquid crystal therebetween.

As shown in FIG. 10, the TFT array substrate 10 has the plurality of pixel electrodes 9a made of transparent Indium Tin Oxide (ITO) films in a matrix thereon. Pixel switching TFTs 30 are connected to each pixel electrode 9a. The data lines 6a, the scanning lines 3a, and the capacitor lines 3b are formed along the longitudinal and transverse boundaries between the pixel electrodes 9a. Each TFT 30 is connected to the data line 6a and the scanning line 3a. That is, the data line 6a is electrically connected to a high-concentration source region 1d of the TFT 30 via a contact hole and a protrusion of the scanning line 3a defines a gate electrode of the TFT 30. To achieve the storage capacitor 70, an extending portion 1f of a semiconductor film 1a, which is used for forming the pixel switching TFT 30, is rendered conductive to form a lower electrode 41 and the capacitor line 3b overlaps the lower electrode 41 to form an upper electrode.

With reference to FIG. 11, the base of the TFT array substrate 10 is a transparent substrate 10b. A bedding protective film 11 made from an insulating silicon oxide film having a thickness of between 300 nm and 500 nm is formed on a surface of the transparent substrate 10b. A semiconductor film 1a is formed on the bedding protective film 11 into an island having a thickness of between 30 nm and 100 nm. Then, a gate insulating film 2 made from a silicon oxide film having a thickness of between about 50 nm and 150 nm is formed on a surface of the semiconductor film 1a, followed by the scanning line 3a having a thickness of between 300 nm and 800 nm thereon. Part of the area of the semiconductor film 1a that opposes the scanning lines 3a with the gate insulating film 2 therebetween is a channel region 1a'. A source region of a low-concentration source region 1b and a high-concentration source region 1d is formed on one side of the channel region 1a', while a drain region consisting of a low-concentration drain region 1c and a high-concentration drain region 1e is formed on the other side of the channel region 1a'.

An insulating interlayer 4 made from a silicon oxide film having a thickness of between 300 nm and 800 nm is formed on a surface of the pixel switching TFT 30, followed by an insulating interlayer 5 made from a silicon nitride film having a thickness of between 100 nm and 300 nm thereon. A data line 6a having a thickness of between 300 nm and 800 nm is formed on a surface of the insulating interlayer 4. The data line 6a is electrically connected to the high-concentration source region 1d through a contact hole in the insulating interlayer 4. A drain electrode 6b is formed on the insulating interlayer 4 simultaneously with the data line 6a. The drain electrode 6b is electrically connected to the high-concentration drain region 1e through a contact hole in the insulating interlayer 4.

On top of the insulating interlayer 5, irregularity forming layers 13a made of transmissive, photosensitive resin are formed in a predetermined pattern. An upper insulating film 7a made of transmissive, photosensitive resin is formed over the irregularity forming layers 13a, followed by a light reflecting film 8a made of aluminum thereon. Therefore, the surface of the light reflecting film 8a has an irregular surface pattern 8g following the irregularities of the irregularity forming layers 13a. The irregular surface pattern 8g is shaped like a smooth curve. Although FIG. 10 illustrates hexagonal irregularity forming layers 13a in plan view, the shapes may be circular, octagonal, or various other shapes.

The pixel electrodes 9a are formed on the light reflecting film 8a. The pixel electrodes 9a may be directly layered on the surface of the light reflecting film 8a. The pixel electrode 9a is electrically connected to the drain electrode 6b through a contact hole in the upper insulating film 7a, the irregularity forming layer 13a, and the insulating interlayer 5.

The light reflecting film 8a has a rectangular light-transmitting window 8d at a part of the contact area with the pixel electrode 9a. Inside the light-transmitting window 8d, the pixel electrode 9a made of ITO exists, but not the light reflecting film 8a.

An alignment layer 12 made of polyimide is formed over the pixel electrode 9a. The alignment layer 12 is a polyimide film processed by rubbing.

The capacitor line 3b (an upper electrode) is disposed above the extending portion 1f (a lower electrode) of the high-concentration drain region 1e with an insulating film (a dielectric film), which is formed simultaneously with the gate insulating film 2, disposed therebetween to define the storage capacitor 70.

Thus, in the liquid crystal unit 100 according to this embodiment, since the light reflecting film 8a is disposed under the transparent pixel electrode 9a, light incident from the counter substrate 20 side is reflected on the TFT array substrate 10 side and an image is displayed by the light emitted from the TFT array substrate 10 side (a reflective mode). Light from a backlight unit mounted on the back surface of the TFT array substrate 10 (not shown) to the light-transmitting window 8d, where the light reflecting film 8a does not exist, passes therethrough onto the counter substrate 20, thereby allowing a transmissive display mode as well.

Preferably, the TFT 30 has the above-described LDD structure, however, it may have the offset structure in which regions corresponding to the low-concentration source region 1b and the low-concentration drain region 1c are not implanted with impurity ions. Additionally, the TFT 30 may be a self-aligned TFT in which the gate electrode (a part of the scanning line 3a) serves as a mask to self-align high-concentration impurity ions implanted to form high-concentration source and drain regions.

Although the TFT 30 according to this embodiment has a single gate structure in which a single gate electrode (scanning line 3a) is disposed in the source and drain region, two or more gate electrodes may be disposed. In this case, the same signal is applied to all the gate electrodes. The TFT 30 having dual (double) or more than three gates prevents leakage current from the contact area between the channel and the source/drain region, thereby reducing the current during an off-state. If at least one of the gate electrodes has the LDD structure or the offset structure, the off-state current is further reduced, thus achieving a more stable switching element.

Figure 8:
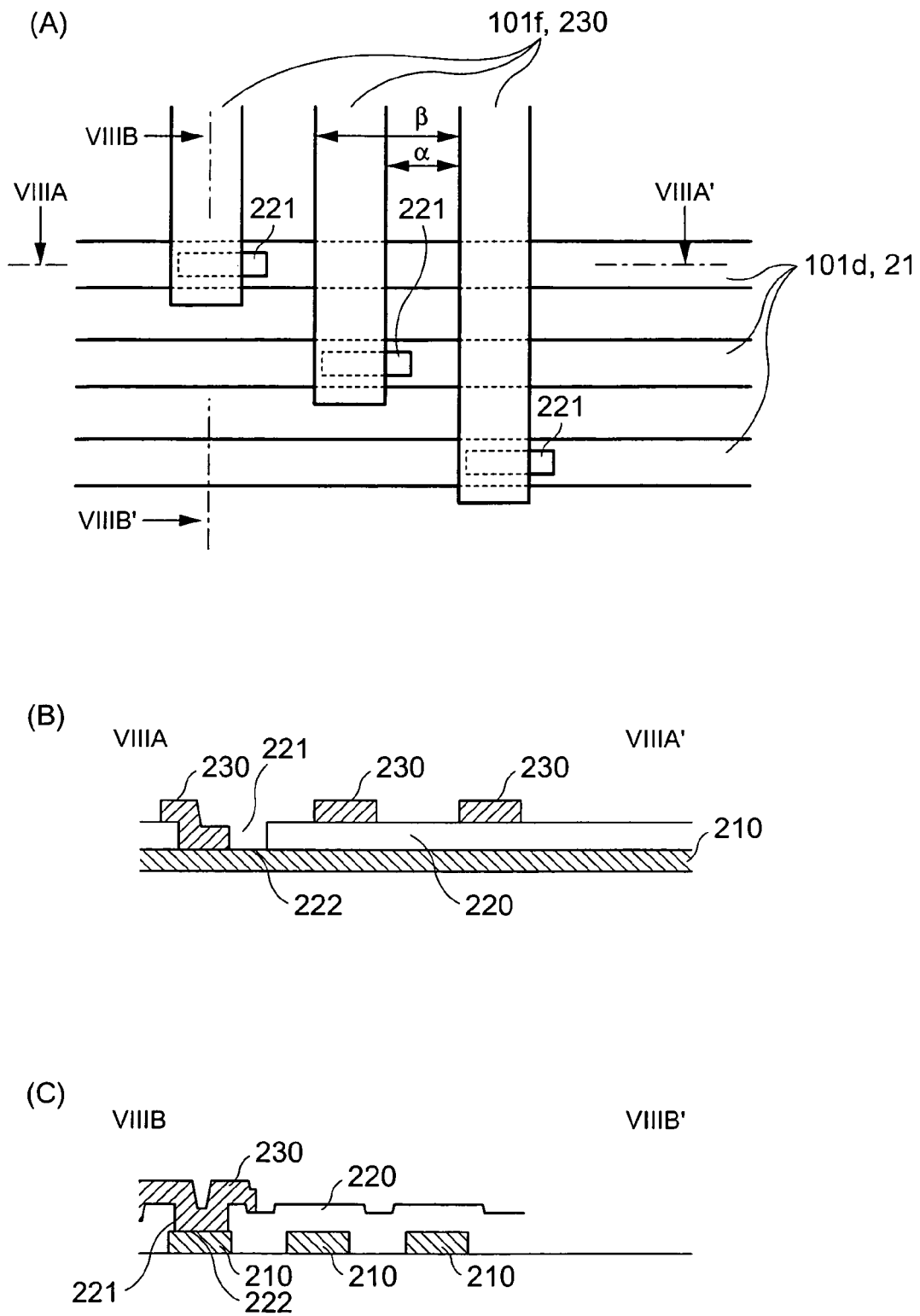
FIGS. 8(A), 8(B), and 8(C) are a plan view of wiring lines electrically connected through contact holes in the liquid crystal unit shown in FIG. 5, a sectional view along line VIIIA–VIIIA' in FIG. 8(A), and a sectional view along line VIIIB–VIIIB' in FIG. 8(A), respectively.

In addition to the regions described with reference to FIG. 8, electrical connections using contact holes in an insulating interlayer are employed between the source region 1d and the data line 6a of the TFT 30, between the drain region 1e and the drain electrode 6b, and between the drain electrode 6b and the pixel electrode 9a. Accordingly, the present invention can be applied to these electrical connections.

The counter substrate 20 has the light shielding films 23, referred to as "a black matrix" or "black stripes", thereon at the position opposing the longitudinal and transverse boundaries of the pixel electrodes 9a on the TFT array substrate 10. A counter electrode 21 made of an ITO film is formed over the light shielding films 23. An alignment layer 22 made of polyimide is formed over the counter electrode 21. The alignment layer 22 is a polyimide film processed by rubbing.

With reference again to FIG. 5(A), in the liquid crystal unit 100 according to this embodiment, peripheral circuits, such as the data line driving circuit 101 and the scanning line driving circuits 104, are formed in the peripheral region of the image display area 10a on the TFT array substrate 10. The data line driving circuit 101 and the scanning line driving circuits 104 are basically composed of N-channel TFTs and P-channel TFTs shown in FIGS. 12 and 13.

Figure 12:
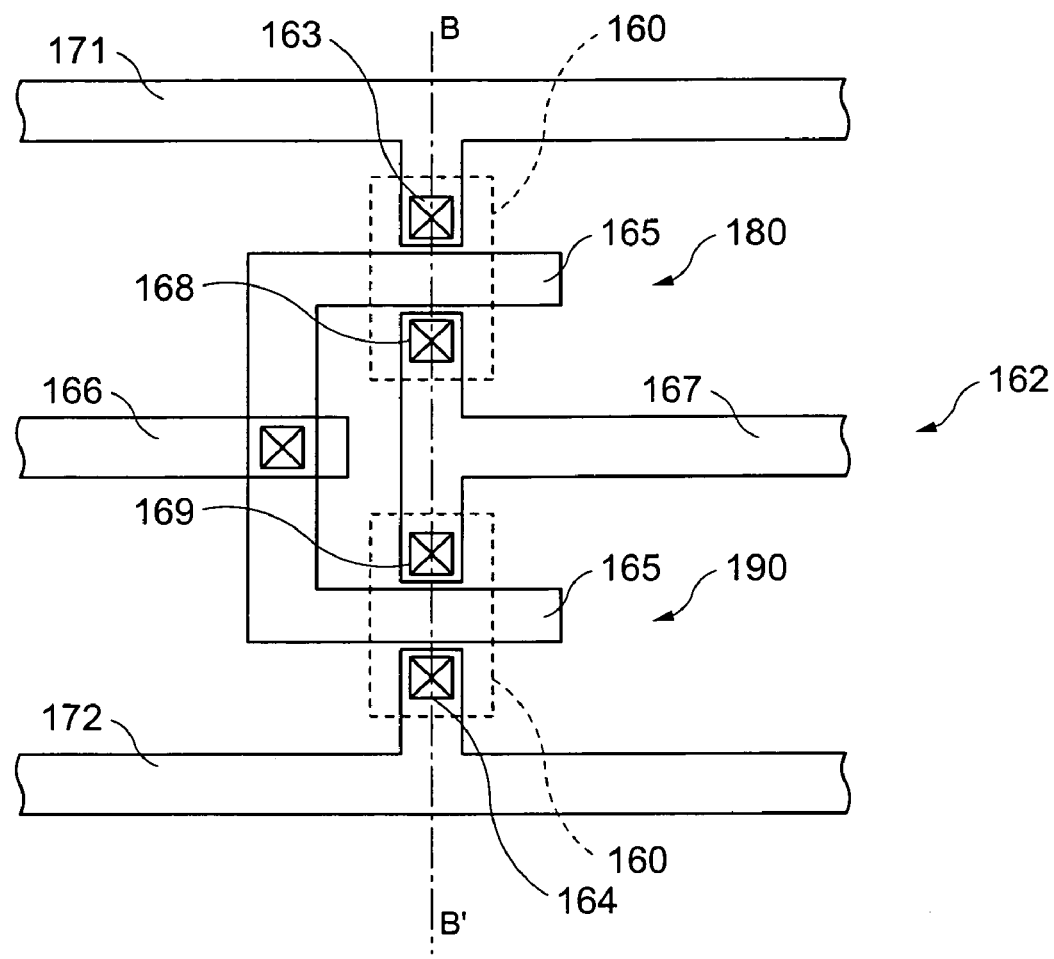
FIG. 12 is a plan view of the driving circuit shown in FIG. 5.
Figure 13:
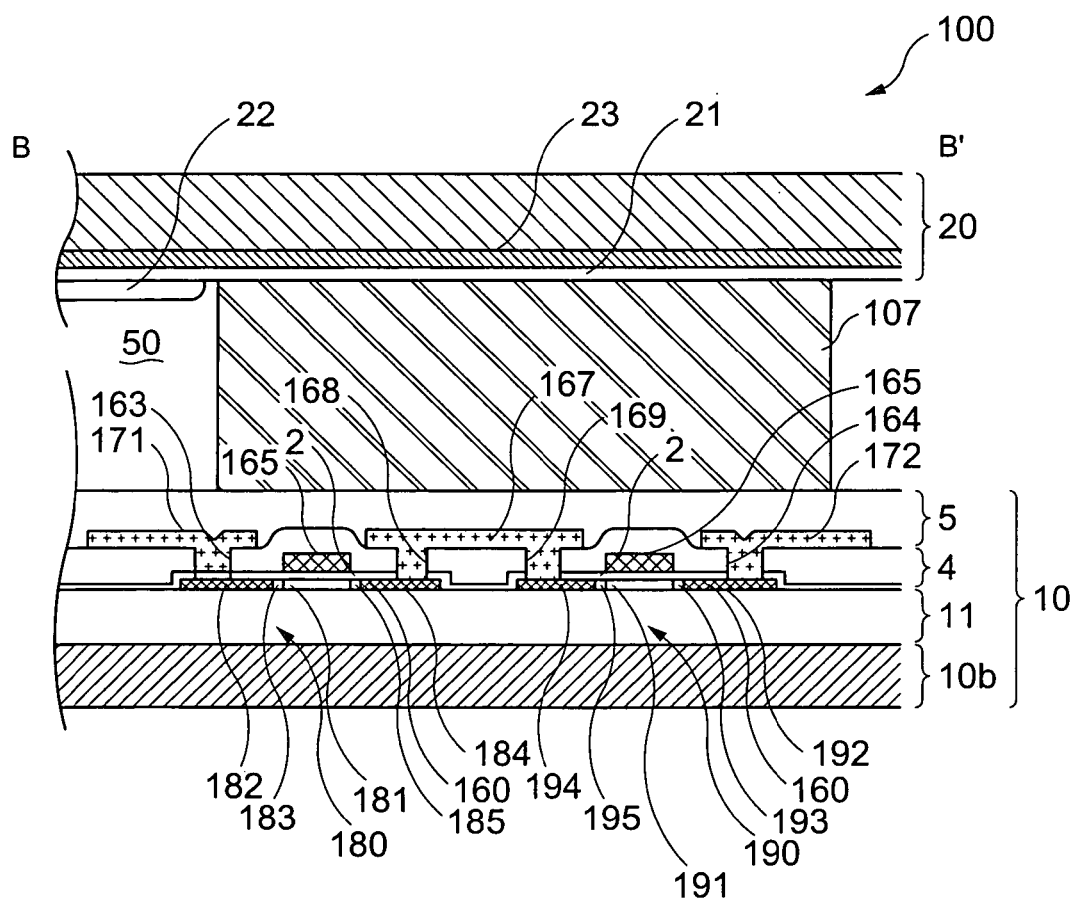
FIG. 13 is a sectional view of a TFT for the driving circuit shown in FIG. 12.

FIG. 12 is a plan view of the TFT which constitutes peripheral circuits including the scanning line driving circuits 104 and the data line driving circuit 101. FIG. 13 is a sectional view of the TFT along line B–B' in FIG. 12. As shown in FIGS. 12 and 13, the TFT which constitutes the peripheral circuit can be a complementary-type TFT composed of a P-channel TFT 180 and an N-channel TFT 190. Semiconductor films 160 which constitute the TFT 180 and the TFT 190 for the driving circuits are formed into islands on the bedding protective film 11 of the transparent substrate 10b. The dashed line in FIG. 12 shows the outlines of the semiconductor films 160.

In the TFT 180 and the TFT 190, a high potential line 171 and a low potential line 172 are electrically connected to source regions of the semiconductor films 160 via contact holes 163 and 164, respectively. An input wiring line 166 is electrically connected to a common gate electrode 165. An output wiring line 167 is electrically connected to drain regions of the semiconductor films 160 via contact holes 168 and 169.

Such a peripheral circuit region can be formed by the same processes as those for forming the image display area 10a. Accordingly, the peripheral circuit region also has the insulating interlayers 4 and 5, and the gate insulating film 2 therein. Like the pixel switching TFT 30, the TFTs 180 and 190 for driving circuits have the LDD structure. A source region consisting of a high-concentration source region 182 and a low-concentration source region 183 and a drain region consisting of a high-concentration drain region 184 and a low-concentration drain region 185 are respectively disposed on both sides of channel regions 181. Also, a source region consisting of a high-concentration source region 192 and a low-concentration source region 193 and a drain region consisting of a high-concentration drain region 194 and a low-concentration drain region 195 are respectively disposed on both sides of a channel region 191.

Thus, in the driving circuits, the high potential line 171 and the low potential line 172 are electrically connected to the source regions via contact holes. Also, the output wiring line 167 is electrically connected to the drain regions via contact holes. Accordingly, the present invention may be applied to these electrical connections.

In the above-described embodiments, the present invention is applied to a TFT array substrate included in an active matrix electro-optical unit as a semiconductor device. However, it should be understood that the present invention may be applied to a device substrate (semiconductor device) included in an active matrix electro-optical unit using thin-film diode elements as pixel switching elements.

Additionally, the invention may be applied to an electro-optical unit using an electro-optical substance other than liquid crystal, for example, a TFT array substrate used for an organic electroluminescent display unit, as will be described hereinafter with reference to FIG. 14, or fabrication of a semiconductor device other than an electro-optical unit.

Figure 14:
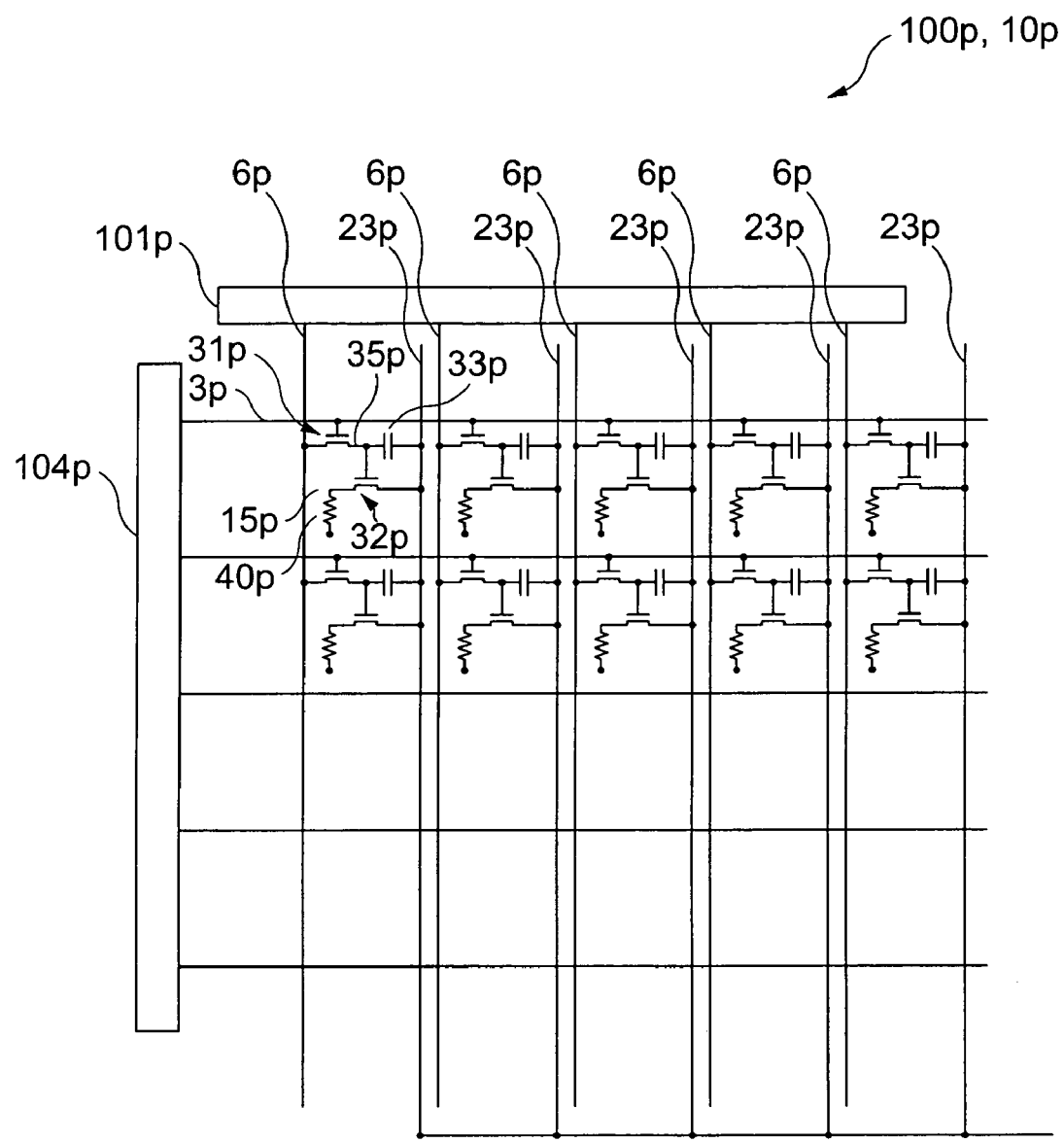
FIG. 14 is an exemplary block diagram of an active matrix electro-optical unit including charge-injection organic thin-film electroluminescent elements.

FIG. 14 is an exemplary block diagram of an active matrix electro-optical unit including a charge-injection organic thin-film electroluminescent element. With reference to FIG. 14, an electro-optical unit (semiconductor device) 100p is an active matrix display unit in which TFTs drive light emitting elements, such as electroluminescent (EL) elements or light-emitting diodes (LEDs) which emit light by flowing drive currents in organic semiconductor films. Light emitting elements used for such an electro-optical unit are self-luminous so that a backlight is advantageously eliminated and the viewing angle dependency is reduced.

In the electro-optical unit 100p, a plurality of scanning lines 3p, a plurality of data lines 6p extending in the direction crossing the scanning lines 3p, a plurality of common power supply lines 23p extending in parallel to the data lines 6p, and pixel regions 15p defined by the intersections of the data lines 6p and the scanning lines 3p are disposed on a TFT array substrate 10p. The data lines 6p are connected to the data line driving circuit 101p, which has a shift register, a level shifter, a video line, and an analog switch. The scanning lines 3p are connected to a scanning line driving circuit 104p, which has a shift register and a level shifter.

Each pixel region 15p includes a first TFT (semiconductor element) 31p in which a scanning signal is supplied to its gate electrode via the scanning line 3p, a holding capacitor (thin-film capacitor element) 33p which holds an image signal supplied from the data line 6p via the first TFT 31p, a second TFT (semiconductor element) 32p in which the image signal held by the holding capacitor 33p is supplied to its gate electrode, and a light emitting element 40p to which a drive current flows from the common power supply line 23p when connecting to the common power supply lines 23p via the second TFT 32p. In the light emitting element 40p, a hole-injecting layer, an organic semiconductor film, which is an organic electroluminescent layer, and a counter electrode made from a metal film, such as aluminum containing lithium, or calcium, are layered on a pixel electrode, although none are shown.

In such an electro-optical unit, since a plurality of the data lines 6p extend from the data line driving circuit 101p with a predetermined pitch and a plurality of the scanning lines 3p extend from the scanning line driving circuits 104p with a predetermined pitch, electrical connections via contact holes are employed. Accordingly, the present invention may be applied to these electrical connections.

An electro-optical unit according to the present invention, such as the liquid crystal unit 100, can be used for electronic apparatuses as display units thereof. Examples will now be described with reference to FIGS. 15(A) and 15(B).

Figure 15:
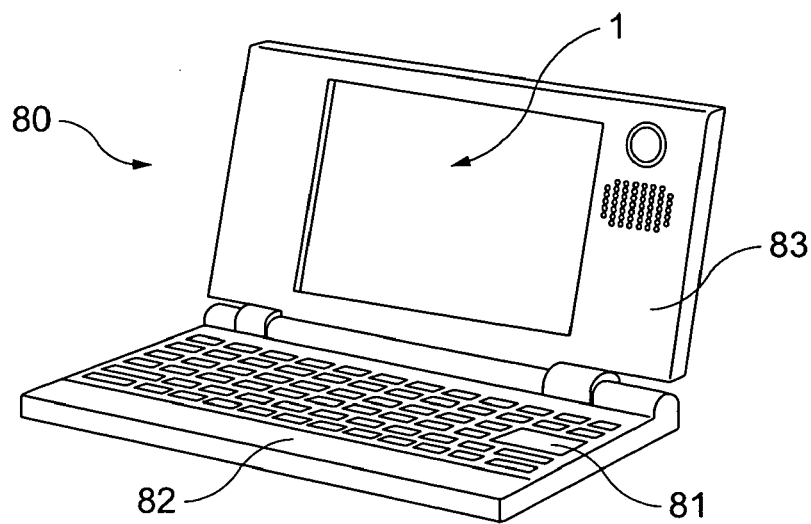
FIGS. 15(A) and 15(B) are views for explaining a mobile personal computer and a mobile telephone including liquid crystal units according to the present invention, respectively.
Figure 15:
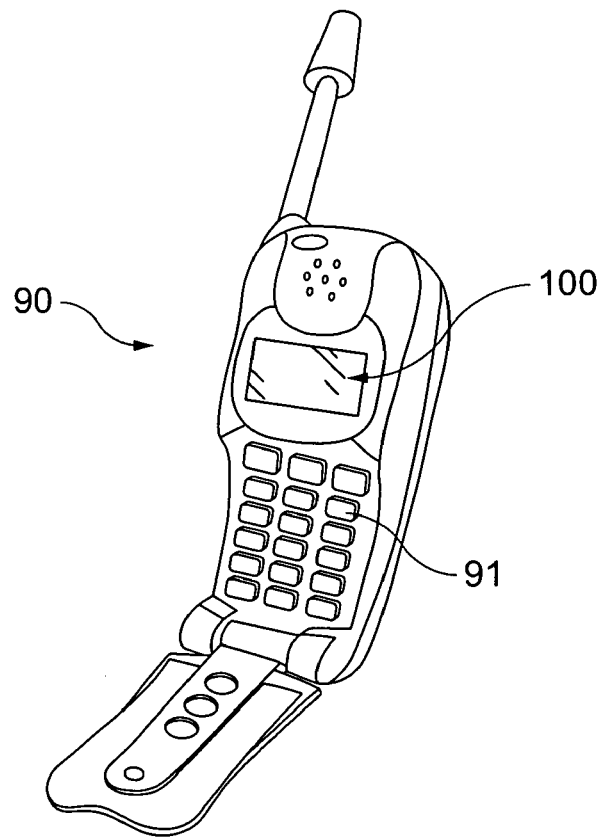
Figure 16:
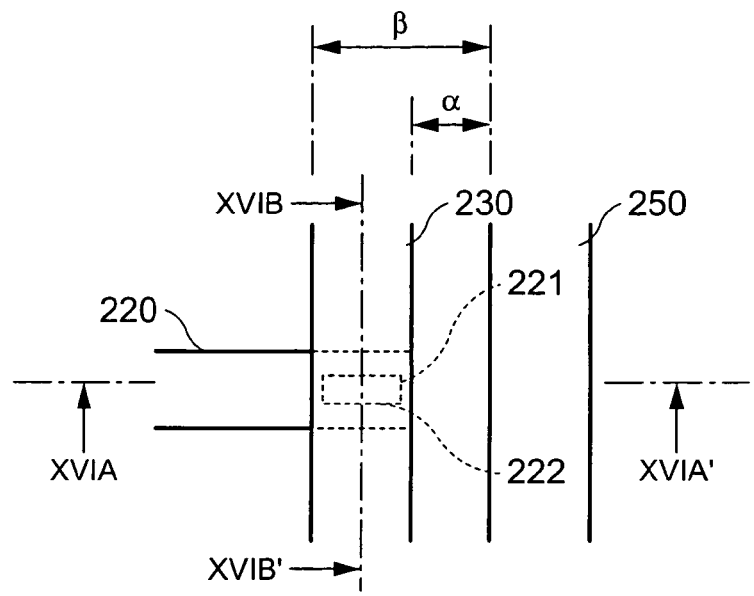
FIGS. 16(A), 16(B), and 16(C) are a plan view illustrating the relevant portion of the structure of a known semiconductor device, a sectional view along line XVIA–XVIA' in FIG. 16(A), and a sectional view along line XVIB–XVIB' in FIG. 16(A), respectively.
Figure 16:
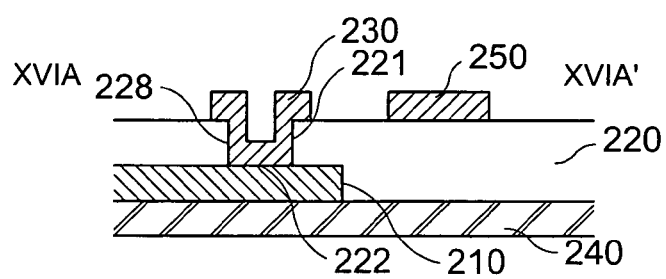
Figure 16:
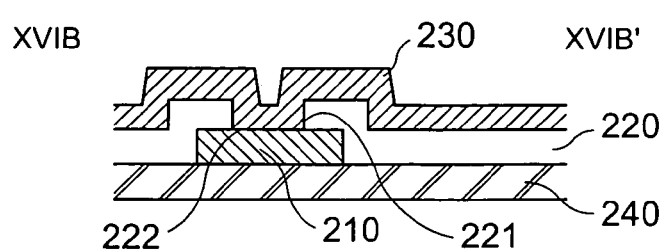

FIG. 15(A) shows a mobile personal computer, which is an embodiment of an electronic apparatus according to the present invention. A personal computer 80 includes a main body 82 having a keyboard 81 and a liquid crystal display unit 83. The liquid crystal display unit 83 includes the above-described liquid crystal unit 100.

FIG. 15(B) shows a mobile telephone, which is another embodiment of the electronic apparatuses according to the present invention. The mobile telephone 90 has a plurality of operation buttons 91 and a display unit including the above-described liquid crystal unit 100.

While the invention has been described in conjunction with specific embodiments thereof, it is evident that many alternatives, modifications and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A semiconductor device, comprising:
   a first conductive layer formed on a substrate;
   an insulating interlayer positioned over the first conductive layer, the insulating interlayer having a contact hole, going through the insulating interlayer, that is at least partially disposed directly on the first conductive layer; and
   a second conductive layer formed on the insulating interlayer, the second conductive layer being electrically coupled to the first conductive layer through the contact hole;
   the contact hole extending beyond either an edge of the first conductive layer or an edge of the second conductive layer in plan view;
   the first conductive layer entirely overlapping the contact hole and the second conductive layer partially overlapping the contact hole in plan view; and
   one of the first conductive layer and the second conductive layer extending parallel to one another at a predetermined pitch.

2. The semiconductor device according to claim 1, one of the first and second conductive layers intersecting the other of the first and second conductive layers.

3. The semiconductor device according to one of claim 1, the second conductive layer overlapping the contact hole that is shifted to one side of the second conductive layer.

4. The semiconductor device according to claim 1, the second conductive layer overlapping the contact hole, two opposing edges of the contact hole being outside of the second conductive layer.

5. The semiconductor device according to claim 1, the contact hole being rectangular, but not square, in plan view and the second conductive layer partially overlapping the contact hole in a lengthwise direction.

6. The semiconductor device according to claim 1, the contact hole being rectangular, but not square, in plan view and the second conductive layer extending diagonally with respect to edges of the contact hole.

7. An electro-optical unit comprising a substrate, the semiconductor device according to claim 1 being used for the substrate of the electro-optical unit to hold an electro-optical substance and pixels having pixel switching transistors, and pixel electrodes being disposed in a matrix on the substrate of the electro-optical unit.

8. The electro-optical unit according to claim 7, the electro-optical substance being liquid crystal disposed between the substrate of the electro-optical unit and a counter substrate.

9. The electro-optical unit according to claim 7, the electro-optical substance being an organic electroluminescent substance that constitutes light emitting elements on the substrate of the electro-optical unit.

10. An electronic apparatus comprising the electro-optical unit according to claim 7.

* * * * *